(12) United States Patent
Chen et al.

(10) Patent No.: US 12,396,128 B2
(45) Date of Patent: Aug. 19, 2025

(54) MULTI-STAGE LIQUID COOLING SYSTEM

(71) Applicant: Quanta Computer Inc., Taoyuan (TW)

(72) Inventors: Chao-Jung Chen, Taoyuan (TW);
Yu-Nien Huang, Taoyuan (TW);
Herman Tan, Taoyuan (TW);
Tien-Juei Chuang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 249 days.

(21) Appl. No.: 18/055,650

(22) Filed: Nov. 15, 2022

(65) Prior Publication Data

US 2024/0057284 A1  Feb. 15, 2024

Related U.S. Application Data

(60) Provisional application No. 63/396,880, filed on Aug. 10, 2022.

(51) Int. Cl.
*H05K 7/20* (2006.01)
(52) U.S. Cl.
CPC ..... *H05K 7/20263* (2013.01); *H05K 7/20254* (2013.01); *H05K 7/20272* (2013.01); *H05K 7/20318* (2013.01); *H05K 7/20718* (2013.01); *H05K 7/20763* (2013.01); *H05K 7/208* (2013.01)
(58) Field of Classification Search
CPC ........... H05K 7/20263; H05K 7/20254; H05K 7/20272; H05K 7/20318; H05K 7/20718; H05K 7/20763; H05K 7/208; H05K 7/20218; F25B 25/005
USPC ........................................................ 62/259.2
See application file for complete search history.

(56) References Cited

U.S. PATENT DOCUMENTS

| 2014/0137582 A1* | 5/2014 | Louvar | ............. H05K 7/20309 |
| | | | 62/509 |
| 2020/0154610 A1* | 5/2020 | Wilks | ................. H05K 7/20818 |

FOREIGN PATENT DOCUMENTS

GB          2134645 A  *  8/1984  ............... F24F 1/02

* cited by examiner

*Primary Examiner* — Cassey D Bauer
(74) *Attorney, Agent, or Firm* — NIXON PEABODY LLP

(57) ABSTRACT

A system for cooling a heat-generating electronic component includes a first stage, a second stage, and a heat exchanger. The first stage has a first cooling path that circulates a first cooling fluid past the heat-generating electronic component to cause the first cooling fluid to absorb heat from the heat-generating electronic component and the temperature of the first cooling fluid to increase. The second stage circulates a second cooling fluid to increase a pressure of the second cooling fluid, remove heat from the second cooling fluid to decrease a temperature of the second cooling fluid, and decrease the pressure of the second cooling fluid to further decrease the temperature of the second cooling fluid. The heat exchanger is fluidly connected to the first stage and the second stage, and causes the second cooling fluid to flow past and absorb heat from the first cooling fluid.

21 Claims, 3 Drawing Sheets

MULTI-STAGE LIQUID COOLING SYSTEM

CROSS-REFERENCE TO RELATED APPLICATIONS

This application claims priority from and the benefit of U.S. Provisional Patent Application Ser. No. 63/396,880, filed on Aug. 10, 2022, titled "High Performance Low Approach Temperature Liquid Cooling Rack Solution," which is hereby incorporated by reference herein in its entirety.

FIELD OF THE INVENTION

The present invention relates generally to systems and methods for cooling heat-generating electronic components, and more specifically, to systems and methods for using multiple cooling fluids circulating within multiple stages cool heat-generating electronic components.

BACKGROUND OF THE INVENTION

Computing devices (such as servers) typically contain one or more heat-generating electronic components, such as a central processing unit (CPU), a graphics processing unit (GPU), and others. To aid in cooling these heat-generating electronic components, fluid cooling systems can be used that circulate a liquid cooling fluid past the heat-generating electronic components. However, the heat removal capacity of these cooling systems is often limited by the ambient temperature of the air that is used to remove heat from the cooling fluid. Thus, improved systems and methods for cooling heat-generating electronic components are needed.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In a first implementation, a cooling system for cooling one or more heat-generating electronic components of a computing system includes a first stage, a second stage, and a heat exchanger. The first stage has a first cooling path that is configured to circulate a first cooling fluid past the one or more heat-generating electronic components. The first cooling path causes the first cooling fluid to absorb heat from the one or more heat-generating electronic components such that a temperature of the first cooling fluid increases. The second stage has a second cooling path that is configured to circulate a second cooling fluid. The second cooling path causes (i) an initial increase in a pressure of the second cooling fluid, (ii) subsequent to the initial increase in the pressure, heat to be removed from the second cooling fluid such that a temperature of the second cooling fluid decreases, and (iii) in response to the heat being removed, a decrease in the pressure of the second cooling fluid to further decrease the temperature of the second cooling fluid. The heat exchanger is fluidly connected to the first cooling path and the second cooling path, and is configured to cause the second cooling fluid to flow past and absorb heat from the first cooling fluid. The temperature of the second cooling fluid increases in response to absorbing the heat from the first cooling fluid.

In some aspects of the first implementation, the first stage includes at least one thermal plate configured to contact the one or more heat-generating electronic components.

In some aspects of the first implementation, the at least one thermal plate is configured to receive the first cooling fluid such that the first cooling fluid flows past the one or more heat-generating electronic components.

In some aspects of the first implementation, the at least one thermal plate includes a plurality of thermal plates. Each of the plurality of thermal plates is configured to receive a portion of the first cooling fluid.

In some aspects of the first implementation, the first stage includes an input manifold configured to receive the first cooling fluid from the heat exchanger and direct a respective portion of the first cooling fluid to each of the plurality of thermal plates.

In some aspects of the first implementation, the first stage includes an output manifold configured to receive the respective portion of the first cooling fluid from each of the plurality of thermal plates and direct the first cooling fluid to the heat exchanger.

In some aspects of the first implementation, the first stage includes a distribution unit configured to cause the first cooling fluid to flow between the heat exchanger and the at least one thermal plate.

In some aspects of the first implementation, the second stage includes a compressor fluidly connected to the heat exchanger. The compressor is configured to receive the second cooling fluid from the heat exchanger in a vapor phase, and increase the pressure of the second cooling fluid such that the temperature of the second cooling fluid increases.

In some aspects of the first implementation, the second cooling fluid is a saturated vapor after absorbing heat from the first cooling fluid in the heat exchanger, and the temperature of the second cooling fluid is equal to a saturation temperature of the second cooling fluid.

In some aspects of the first implementation, the second cooling fluid is a superheated vapor after the temperature of the second cooling fluid increases in the compressor, and the temperature of the second cooling fluid is greater than the saturation temperature of the second cooling fluid.

In some aspects of the first implementation, the second stage further includes a condenser fluidly connected to the compressor. The condenser is configured to remove heat from the second cooling fluid such that the temperature of the second cooling fluid decreases and at least a portion of the second cooling fluid flowing through the condenser transitions from the vapor phase to a liquid phase.

In some aspects of the first implementation, the second cooling fluid is a saturated liquid after the condenser removes heat from the second cooling fluid and the temperature of the second cooling fluid is equal to the saturation temperature of the second cooling fluid, or wherein the second cooling fluid is a subcooled liquid after the condenser removes heat from the second cooling fluid and the temperature of the second cooling fluid is less than the saturation temperature of the second cooling fluid.

In some aspects of the first implementation, the second stage further includes an expansion valve fluidly connected to the condenser. The expansion valve is configured to decrease the pressure of the second cooling fluid such that the temperature of the second cooling fluid further decreases.

In some aspects of the first implementation, the second cooling fluid is a liquid after the expansion valve decreases the pressure of the second cooling fluid. In some aspects of the first implementation, the second cooling fluid is a liquid-vapor mixture after the expansion valve decreases the pressure of the second cooling fluid.

In some aspects of the first implementation, the expansion valve is fluidly connected to the heat exchanger, and the heat exchanger is configured to receive the second cooling fluid in the liquid phase or as the liquid-vapor mixture from the expansion valve.

In some aspects of the first implementation, the cooling system further includes a radiator-condenser unit fluidly connected to the first stage and the second stage. The radiator-condenser unit includes a radiator through which the first cooling fluid flows, and a condenser through which the second cooling fluid flows. The radiator-condenser unit is configured to remove heat from the first cooling fluid and the second cooling fluid.

In some aspects of the first implementation, the radiator-condenser unit includes one or more air-moving devices configured to cause air to flow past the radiator and the condenser to thereby remove heat from the first cooling fluid and the second cooling fluid.

In some aspects of the first implementation, the radiator is configured to receive the first cooling fluid after the first cooling fluid absorbs the heat from the one or more heat-generating electronic components, and direct the first cooling fluid to the heat exchanger after the heat is removed from the first cooling fluid.

In some aspects of the first implementation, the condenser is configured to receive the second cooling fluid from the compressor and direct the second cooling fluid to an expansion valve.

In a second implementation, a method of cooling one or more heat-generating electronic components of a computing system includes causing a first cooling fluid to flow past and absorb heat from the one or more heat-generating electronic components. A temperature of the first cooling fluid increases in response to the heat absorption. The method further includes causing the first cooling fluid to flow through a heat exchanger after the first cooling fluid absorbs the heat from the one or more one heat-generating electronic component, and back toward the one or more heat-generating electronic components. The method further includes causing the second cooling fluid to flow through the heat exchanger as the first cooling fluid flows through the heat exchanger such that the second cooling fluid absorbs heat from the first cooling fluid and a temperature of the second cooling fluid increases. The method further includes increasing a pressure of the second cooling fluid phase using a compressor. The method further includes, subsequent to increasing the pressure of the second cooling fluid, removing heat from the second cooling fluid using a condenser such that the temperature of the second cooling fluid decreases. The method further includes, subsequent to removing the heat from the second cooling fluid, decreasing the pressure of the second cooling fluid in the liquid phase using an expansion valve such that the temperature of the second cooling fluid further decreases.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
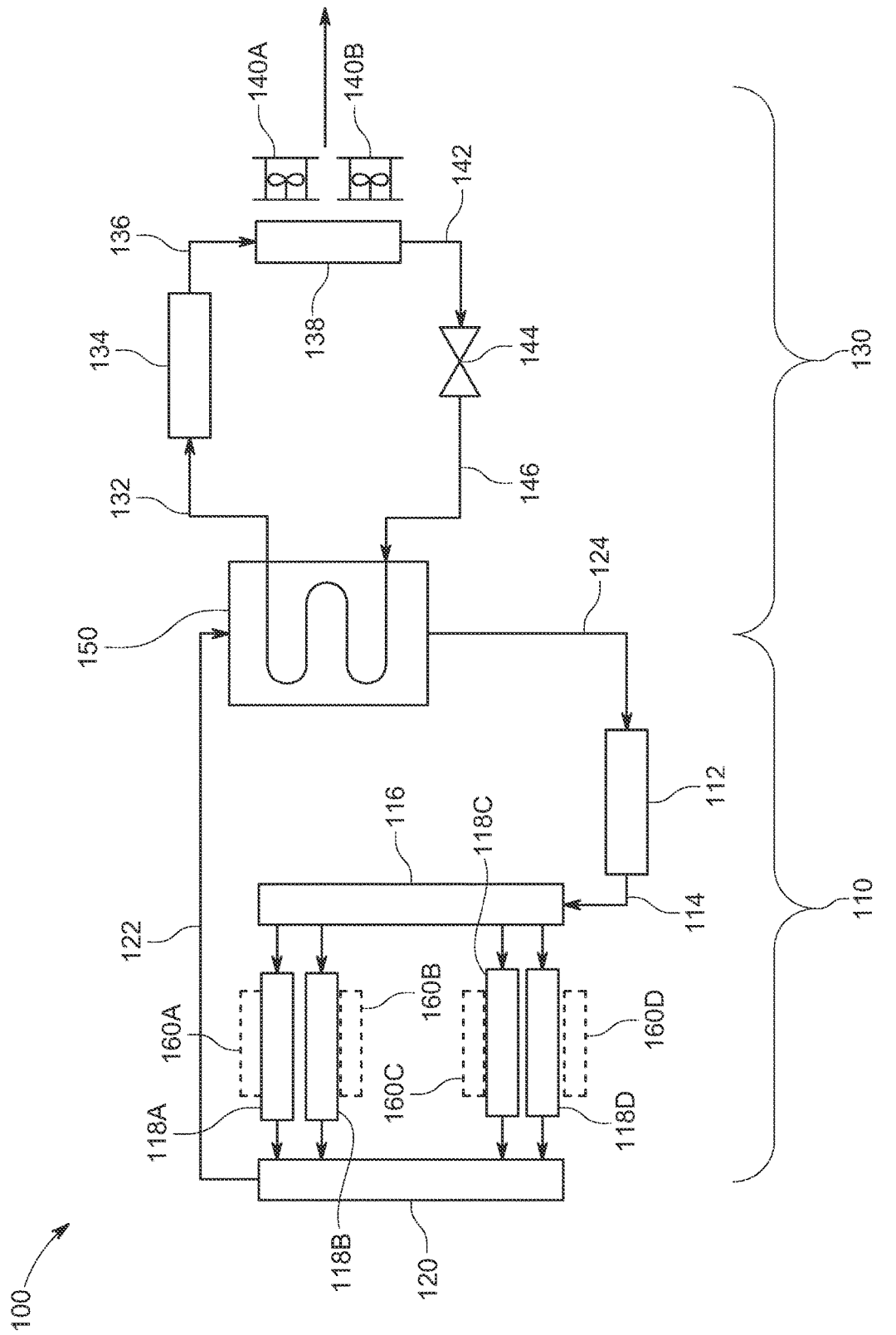
FIG. 1 is a block diagram of a first system for cooling one or more heat-generating electronic components, according to certain aspects of the present disclosure.

The examples disclosed herein relate to a cable clip that is used to secure one or more cables of a computing device. The cable clip can be coupled to the inside or the outside of the housing of the computing device. The cable clip can also be coupled to some other component or structure inside of or outside of the housing of the computing device. Different implementations of the cable clip include different mechanisms for holding and securing the one or more cables.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1 illustrates a fluid cooling system 100 that can be used to cool one or more heat-generating electronic components, according to certain aspects of the present disclosure. In some implementations, the one or more heat-generating electronic components form a server rack that includes a plurality of individual server devices. The various components of the system 100 can be mounted in the same rack or housing as the heat-generating electronic components, in a different rack or housing as the heat-generating electronic components, or partially in the same rack or housing and partially in a different rack or housing.

The system 100 includes a first stage 110, a second stage 130, and a heat exchanger 150 that is shared between the first stage 110 and the second stage 130. The first stage 110 includes a first cooling path that causes a first cooling fluid to circulate through the first stage 110 and the heat exchanger 150. The second stage 130 includes a second cooling path that causes a second cooling fluid to circulate through the second stage 130 and the heat exchanger 150. As the first cooling fluid and the second cooling fluid flow through the heat exchanger 150, the second cooling fluid absorbs heat from the first cooling fluid. Thus, the first cooling path is a loop through the first stage 110 and the heat exchanger 150 that the first cooling fluid continually circulates within during operation of the system 100. Similarly, the second cooling path is a loop through the second stage 130 and the heat exchanger 150 that the second cooling fluid continually circulates within during operation of the system 100.

The first stage 110 includes a coolant distribution unit (CDU) 112 (sometimes referred to as a distribution unit) that is configured to cause the first cooling fluid to continually circulate through the first stage 110. The CDU 112 includes one or more pumps that cause the first cooling fluid to flow through the first stage 110. The CDU 112 may include additional components or devices, such as one or more processing devices used to control the operation of the system 100, one or more sensors (e.g., temperature sensors, pressure sensors, etc.) that can be used to generate data associated with the operation of the system 100, and/or any other component or device that may be beneficial or necessary to the operation of the system 100.

The first stage 110 further includes an input manifold 116, a plurality of thermal plates 118A-118D (sometimes referred to as cold plates or hot plates), and an output manifold 120. However, implementations according to the present disclosure could include greater or fewer than four thermal plates. A first fluid pathway segment 114 fluidly connects the CDU 112 to the input manifold 116. A second fluid pathway segment 122 fluidly connects the output manifold 120 to the heat exchanger 150. A third fluid pathway segment 124 fluidly connects the heat exchanger 150 and the CDU 112.

The input manifold 116, the plurality of thermal plates 118A-118D, and the output manifold 120 are used to carry the first cooling fluid past the heat-generating electronic components. In some implementations, the heat-generating electronic components, the input manifold 116, the plurality of thermal plates 118A-118D, and the output manifold 120 are all mounted in the same rack.

The input manifold 116 includes a plurality of passageways through which the first cooling fluid flows. The input manifold 116 includes a single input port that is fluidly connected to the first fluid pathway segment 114, and a plurality of output ports that are each fluidly connected to a respective one of the plurality of thermal plates 118A-118D. The input port of the input manifold 116 receives the first cooling fluid from the first fluid pathway segment 114. The volume of the first cooling fluid flowing into the input port is divided among the plurality of passageways that lead from the input port, to the plurality of output ports and the plurality of thermal plates 118A-118D. Thus, the input manifold 116 receives the first cooling fluid from the heat exchanger 150 via the CDU 112, the first fluid pathway segment 114, and the third fluid pathway segment 124. The input manifold 116 further directs a respective portion of the first cooling fluid to each of the plurality of thermal plates 118A-118D.

In the illustrated implementation of FIG. 1, the heat-generating electronic components that are cooled by the system 100 includes heat-generating electronic components 160A, 160B, 160C, and 160D. The heat-generating electronic component 160A is positioned so as to be in contact with (or in close proximity to) thermal plate 118A. The heat-generating electronic component 160B is positioned so as to be in contact with (or in close proximity to) thermal plate 118B. The heat-generating electronic component 160C is positioned so as to be in contact with (or in close proximity to) thermal plate 118C. The heat-generating electronic component 160D is positioned so as to be in contact with (or in close proximity to) thermal plate 118D. However, the heat-generating electronic components that are cooled by the system 100 can include more or less than the four heat-generating electronic components 160A-160D shown in FIG. 1.

The first cooling fluid flows through passageways in the plurality of thermal plates 118A-118D to absorb heat from the heat-generating electronic components 160A-160D. The first cooling fluid has a temperature that is less than the temperature of the heat-generating electronic components 160A-160D when the first cooling fluid flows through the input manifold 116 and into the plurality of thermal plates 118A-118D. Thus, the input manifold 116 can also be referred to as the cold manifold. Generally, the thermal plates 118A-118D will be positioned in close proximity to the heat-generating electronic components 160A-160D in order to transfer heat from the heat-generating electronic components 160A-160D to the first cooling fluid. In some implementations, the thermal plates 118A-118D are in direct physical contact with the heat-generating electronic components 160A-160D, in order to facilitate the transfer of heat from the heat-generating electronic components 160A-160D to the thermal plates 118A-118D, and from the thermal plates 118A-118D to the first cooling fluid flowing within the thermal plates 118A-118D.

In the implementation illustrated in FIG. 1, only four thermal plates 118A, 118B, 118C, and 118D are shown. However, the system 100 may generally include any suitable number of thermal plates. In some implementations, the system 100 includes a distinct thermal plate for each heat-generating electronic component being cooled. Thus, if the system 100 is being used to cool n heat-generating electronic components (for example within a single rack), then the system 100 can include n thermal plates. In some implementations, the system 100 may include more or less than a single distinct thermal plate for each heat-generating electronic component being cooled. In some implementations, the system 100 may include only a single thermal plates, which may be used to cool one heat-generating electronic component or a plurality of heat-generating electronic components. In these implementations, the system 100 may not include the input manifold 116 and the output manifold 120. Instead, the single thermal plate can be fluidly connected directly to the first fluid pathway segment 114 and the second fluid pathway segment 122. In general, the system 100 can be used to cool at least one heat-generating electronic component, and will include at least one thermal plate.

The output manifold 120 includes a plurality of passageways through which the first cooling fluid flows. The output manifold 120 includes a plurality of input ports that are fluidly connected to the passageways of the thermal plates 118A-118D, and an output port that is fluidly connected to the second fluid pathway segment 122. After the first cooling fluid flows through the passageways of the plurality of thermal plates 118A-118D, each portion of the first cooling fluid (each portion flowing through one of the plurality of thermal plates 118A-118D) then flows into a respective one of the input ports of the output manifold 120. Each portion of the first cooling fluid flows through one of the plurality of passageways to the output port. The entire volume of the first cooling fluid then flows out of the output port of the output manifold 120, into the second fluid pathway segment 122. The temperature of the first cooling fluid flowing through the output manifold 120—after absorbing heat from the heat-generating electronic components 160A-160D—will generally be at least slightly lower than the temperature of the heat-generating electronic components 160A-160D, and higher than the temperature of the first cooling fluid when it flowed through the input manifold 116. Thus, the output manifold 120 can also be referred to as the hot manifold. However, in some implementations the temperature of the first cooling fluid may generally be equal to the temperature of the heat-generating electronic components 160A-160D after absorbing heat from the heat-generating electronic components 160A-160D.

In some implementations, the input manifold 116 and the output manifold 120 may not have a one-to-one relationship with the plurality of thermal plates 118A-118D. For example, in some implementations, each output port of the input manifold 116 may direct a portion of the total volume of the first cooling fluid to more than one of the thermal plates 118A-118D. Similarly, in some implementations, each input port of the output manifold 120 may receive a portion of the first cooling fluid from more than one of the thermal plates 118A-118D.

In some implementations, the first stage 110 does not include the input manifold 116 and/or the output manifold 120. For example, in some implementations without the input manifold 116, the end of the first fluid pathway segment 114 adjacent to the thermal plates 118A-118D may be large enough to be fluidly connected to all of the thermal plates 118A-118D. In other implementations without the input manifold 116, the end of the first fluid pathway segment 114 may divided into a plurality of separate end portions that each are fluidly connected to at least one of the thermal plates 118A-118D, effectively integrating the input manifold 116 into the first fluid pathway segment 114. Similarly, in some implementations without the output manifold 120, the end of the second fluid pathway segment 122 adjacent to the thermal plates 118A-118D may be large enough to be fluidly connected to all of the thermal plates 118A-118D. In other implementations without the output manifold 120, the end of the second fluid pathway segment 122 may divided into a plurality of separate end portions that each are fluidly connected to at least one of the thermal plates 118A-118D, effectively integrating the output manifold 120 into the second fluid pathway segment 122.

The first cooling fluid, after being heated by the heat-generating electronic components 160A-160D, flows through the second fluid pathway segment 122 to the heat exchanger 150. As shown in FIG. 1, the second cooling fluid flowing through the second stage 130 also flows through the heat exchanger 150. As the two cooling fluids flow through one or more passageways of the heat exchanger 150, heat is transferred from the first cooling fluid to the second cooling fluid. The temperature of the first cooling fluid decreases (generally to less than the temperature of the heat-generating electronic components 160A-160D), while the temperature of the second cooling fluid increases.

The heat exchanger 150 may be any suitable heat exchanger for transferring heat from one fluid to another, such as a shell and tube heat exchanger, a plate heat exchanger, a plate and shell heat exchanger, an adiabatic wheel heat exchanger, a plate fin heat exchanger, a finned tube heat exchanger, a pillow plate heat exchanger, a waste heat recovery unit, a dynamic scraped surface heat exchanger, a phase-change heat exchanger, a direct contact heat exchanger, or any other suitable heat exchanger.

After the first cooling fluid has flowed through one or more passageways of the heat exchanger 150 and been cooled in the heat exchanger 150, the first cooling fluid flows into the third fluid pathway segment 124, which is fluidly connected to both the heat exchanger 150 and the CDU 112. The first cooling fluid then flows through the CDU 112 and back toward the thermal plates 118A-118D, where the first cooling fluid can again remove heat from the heat-generating electronic components 160A-160D.

Thus, in the illustrated implementation, the first cooling path of the first stage includes the CDU 112, the passageways of the input manifold 116, the passageways of the thermal plates 118A-118D, the passageways of the output manifold 120, the passageways of the heat exchanger 150, and the fluid pathway segments 114, 122, and 124. In other implementations however, the first cooling path of the first stage may include additional passageways through the same or more components, fewer passageways through the same or fewer components, or any other suitable configuration. While the heat exchanger 150 itself is shared between the first stage 110 and the second stage 130, the heat exchanger 150 will generally include one or more passageways that are part of the first cooling path and not part of the second cooling path. The first cooling fluid flows through the passageways of the heat exchanger 150 that are part of the first cooling path so that the first cooling fluid does not mix with the second cooling fluid.

When the second cooling fluid absorbs heat from the first cooling fluid within the heat exchanger 150, the temperature of the second cooling fluid increases. Generally, the second cooling fluid is selected such that the absorption of heat from the first cooling fluid raises the temperature of the second cooling fluid above its boiling point. Thus, in some implementations the second cooling fluid is in the liquid phase when it enters the heat exchanger, but transitions to the vapor phase as it absorbs heat from the first cooling fluid. In other implementations, the second cooling fluid is a liquid-vapor mixture when it enters the heat exchanger, but transitions entirely to the vapor phase as it adsorbs heat from the first cooling fluid. At this point within the second stage 130, the second cooling fluid is a saturated vapor, with its temperature generally equal to the saturation temperature of the second cooling fluid. In other implementations however, the second cooling fluid may absorb enough heat from the first cooling fluid in the heat exchanger 150 such that the temperature of the second cooling fluid is greater than the saturation temperature. In these implementations, the second cooling fluid at this point in the second stage 130 is a superheated vapor.

The second stage 130 includes a compressor 134, a fourth fluid pathway segment 132 fluidly connecting the compressor 134 and the heat exchanger 150, a condenser 138, a fifth fluid pathway segment 136 fluidly connecting the compressor 134 and the condenser 138, an expansion valve 144, a sixth fluid pathway segment 142 fluidly connecting the condenser 138 and the expansion valve 144, and a seventh fluid pathway segment fluidly connecting the expansion valve 144 and the heat exchanger. In some implementations, the compressor 134 provides a sufficient amount of pressure to cause the second cooling fluid to circulate within the second stage 130. In other implementations, the second stage 130 may also include a corresponding CDU to aid in causing the second cooling fluid to circulate within the second stage 130. Further, while the illustrated implementation includes two air-moving devices 140A and 140B, any suitable number of air-moving devices can be used with the system 100, including no air-moving devices.

The second cooling fluid (in the vapor phase) flows through the fourth fluid pathway segment 132 to the compressor 134. The compressor 134 includes one or more passageways through which the second cooling fluid flows. As the second cooling fluid flows through the passageways of the compressor 134, the compressor 134 increases the pressure of the second cooling fluid. When this pressure increase occurs, the temperature of the second cooling fluid also increases, and the second cooling fluid becomes superheated vapor that has a temperature greater than the saturation temperature of the second cooling fluid. The compressor 134 can be any suitable device that can be used to increase the pressure of (e.g., compress) the second cooling fluid. For example, in some implementations, the compressor 134 is a positive displacement compressor, such as a reciprocating compressor, an ionic liquid piston compressor, a rotary screw compressor, a rotary vane compressor, a rolling piston compressor, a scroll compressor, or a diaphragm compressor. In other implementations, the compressor 134 is a dynamic compressor, such as an air bubble compressor, a centrifugal compressor, a diagonal or mixed-flow compressor, or an axial compressor. The compressor 134 can be a hermetically sealed compressor, an open compressor, or a semi-hermetic compressor. The compressor 134 can also be a single-stage compressor or a multi-stage compressor.

After the pressure of the second cooling fluid is increased by the compressor 134, the second cooling fluid (still in the vapor phase) travels through the fifth fluid pathway segment 136 to the condenser 138. The condenser 138 includes one or more passageways through which the second cooling fluid flows. As the second cooling fluid flows through the passageways of the condenser 138, the condenser 138 removes heat from the second cooling fluid. In the illustrated implementation, the condenser 138 includes air-moving devices 140A and 140B (which could be fans) that are configured to cause air to flow past the second cooling fluid within the condenser 138, to aid in removing heat from second fluid. The removal of heat from the second cooling fluid in the condenser 138 causes the temperature of the second cooling fluid decreases and the second cooling fluid transitions from the vapor phase to the liquid phase (e.g., condenses back into a liquid). In some implementations, the second cooling fluid at this point within the second stage 130 is a saturated liquid, and the temperature of the second cooling fluid is generally equal to the saturation temperature. In other implementations however, the condenser 138 may remove enough heat from the second cooling fluid such that the temperature of the second cooling fluid is less than the saturation temperature. In these implementations, the second cooling fluid at this point within the second stage 130 is a subcooled liquid. In further implementations, a portion of the second cooling fluid flowing through the condenser 138 remains in the vapor phase, such that the second cooling fluid flowing out of the condenser 138 is a liquid-vapor mixture.

The second cooling fluid then flows through the sixth fluid pathway segment 142 to the expansion valve 144. The expansion valve 144 includes one or more passageways through which the second cooling fluid flows. As the second cooling fluid flows through the passageways of the expansion valve 144, the expansion valve 144 decreases the pressure of the second cooling fluid, which in turn further decreases the temperature of the second cooling fluid (which may remain as a liquid-vapor mixture, or all be in the liquid phase). The expansion valve 144 can be any suitable device used to decrease the pressure of the second cooling fluid, such as an internally equalized thermal expansion valve, an externally equalized thermal expansion valve, a manually operated expansion valve, a capillary tube, an automatic expansion valve, an electronic expansion valve, a float valve, etc. In some implementations, the expansion valve 144 includes a series of tubes which a varying cross-section, which causes the pressure of the second cooling fluid to decrease as it flows through the tubes. For example, in some implementations, the expansion valve 144 includes a first manifold facing a second manifold. The second cooling fluid flows into the input of the first manifold, which then divides into several smaller branches. The branches of the first manifold are coupled to corresponding branches of a second manifold, which then combine into an output of the second manifold. The cross-section of the manifolds increases from the input of the first manifold to the output of the second manifold. Thus, as the second cooling fluid flows through the expansion valve 144, the pressure of the second cooling fluid decreases. At this point within the second stage 130, the temperature of the second cooling fluid is generally less than the saturation temperature, and the portion of the second cooling fluid that is in the liquid phase is a sub-cooled liquid.

Finally, the second cooling fluid flows through the seventh fluid pathway segment 146 from the expansion valve 144 to the heat exchanger 150. As the second cooling fluid flows through one or more passageways of the heat exchanger 150, the second cooling fluid (in its liquid phase or as the liquid-vapor mixture) can again absorb heat from the first cooling fluid, and the now-heated second cooling fluid can continue to flow through the second stage 130.

Thus, in the illustrated implementation, the second cooling path of the second stage includes the passageways of the compressor 134, the passageways of the condenser 138, the passageways of the expansion valve 144, the passageways of the heat exchanger 150, and the fluid pathway segments 132, 136, 142, and 146. In other implementations however, the second cooling path of the second stage may include additional passageways through the same or more components, fewer passageways through the same or fewer components, or any other suitable configuration. While the heat exchanger 150 itself is shared between the first stage 110 and the second stage 130, the heat exchanger 150 will generally include one or more passageways that are part of the second cooling path and not part of the first cooling path. The second cooling fluid flows through the passageways of the heat exchanger 150 that are part of the second cooling path so that the second cooling fluid does not mix with the first cooling fluid.

By increasing the pressure of the second cooling fluid prior to the second cooling fluid flowing through the condenser 138, the heat removal capacity of the second cooling fluid is increased. In general, the heat removal capacity of the condenser 138 and the air-moving devices 140A and 140B is limited by the ambient temperature of the environment where the system 100 is located. Thus, the condenser 138 generally cannot decrease the temperature of the second cooling fluid lower than the ambient temperature. In turn, the second cooling fluid generally cannot decrease the temperate of the first cooling fluid any lower than the ambient temperature, when the first and second cooling fluids flow through the heat exchanger 150. However, by increasing the pressure of the second cooling fluid with the compressor 134 prior to the temperature of the second cooling fluid being decreased to the ambient temperature within the condenser 138, the temperature of the second cooling fluid can then by further decreased by subsequently decreasing the pressure of the second cooling fluid in the expansion valve 144. The second cooling fluid can thus remove more heat from the first cooling fluid within the heat exchanger 150, so that the temperature of the first cooling fluid can be decreased to lower than the ambient temperature. Finally, the first cooling fluid is able to remove more heat from the heat-generating electronic components 160A-160D than it otherwise would be without the compressor 134 and the expansion valve 144.

Any suitable types of fluids can be selected for use in the first stage 110 and the second stage 130. The first cooling fluid used in the first stage 110 has a boiling point that is high enough to prevent the first cooling fluid from transitioning to the vapor phase when absorbing heat from the heat-generating electronic components 160A-160D, and a freezing point that is low enough to prevent the first cooling fluid from transitioning to a solid phase when heat is removed from the first cooling fluid in the heat exchanger 150. The second cooling fluid used in the second stage 130 has a boiling point that is low enough to allow the second cooling fluid to transition from the liquid phase to the vapor phase when absorbing heat from the first cooling fluid in the heat exchanger 150, and to transition from the vapor phase to the liquid phase (but not the solid phase) when the temperature of the second cooling fluid is decreased in the condenser 138 and the expansion valve 144.

Figure 2:
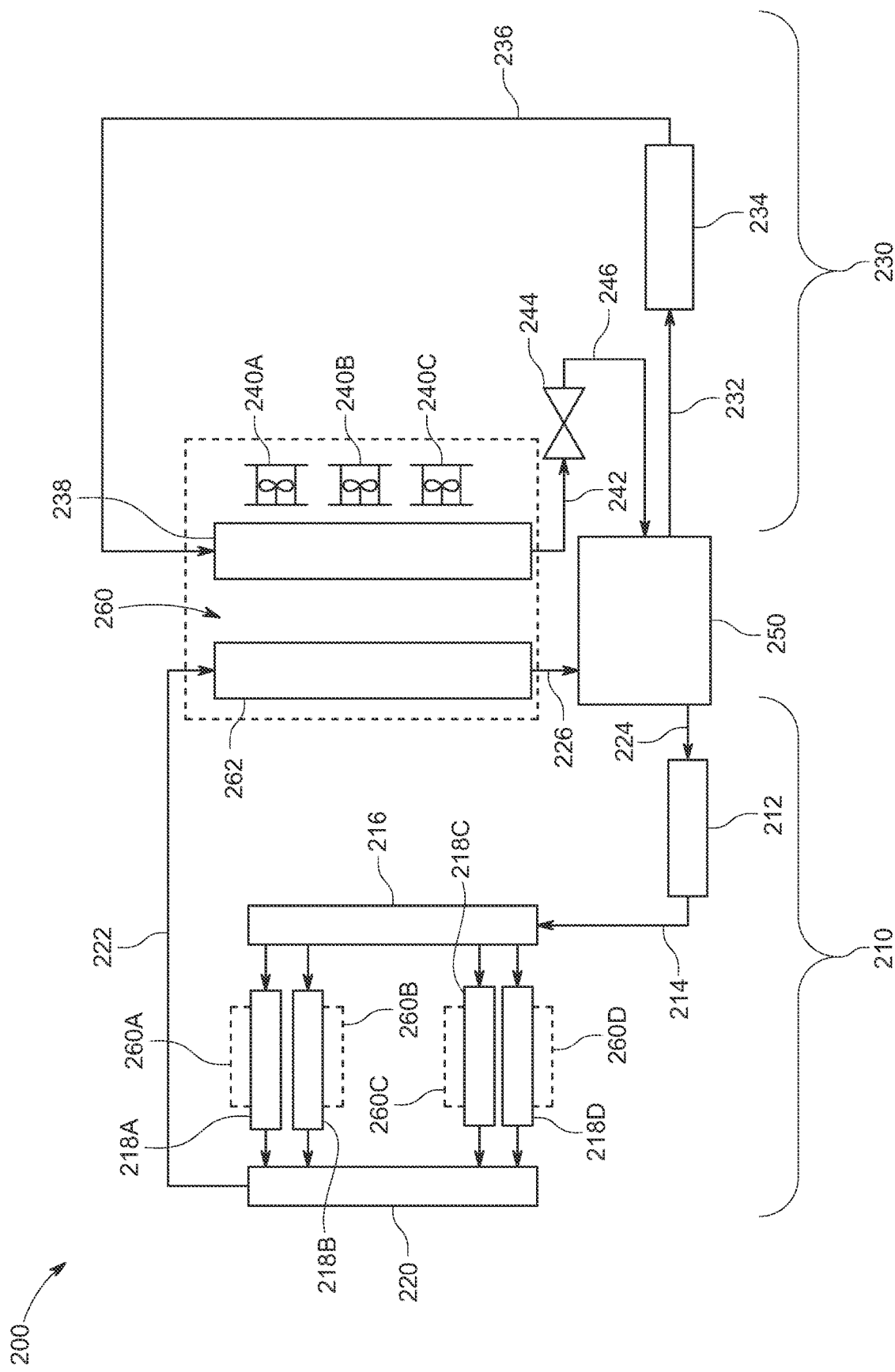
FIG. 2 is a block diagram of a second system for cooling one or more heat-generating electronic components, according to certain aspects of the present disclosure.

FIG. 2 shows a fluid cooling system 200 according to certain aspects of the present disclosure. The fluid cooling system 200 is similar to the system 100 of FIG. 1. The system 200 includes a first stage 210 and a second stage 230 that are each similar to their counterpart stages 110 and 130 in the system 100, and include respective first and second cooling paths through which first and second cooling fluid circulates. A heat exchanger 250 is shared between the first stage 210 and the second stage 230. The first stage 210 includes a CDU 212, an input manifold 216 fluidly connected to the CDU via a first fluid pathway segment 214, a plurality of thermal plates 218A-218D fluidly connected to the input manifold 216, an output manifold 220 fluidly connected to the thermal plates 218A-218D, a second fluid pathway segment 222 fluidly connecting the output manifold 220 to the heat exchanger 250, and a third fluid pathway segment 224 fluidly connecting the heat exchanger 250 to the CDU 212. Each of these components is the same as or similar to its counterpart component in the first stage 110 in FIG. 1. Similar to the system 100 in FIG. 1, while the system 200 is illustrated as having four thermal plates 218A, 218B, 218C, and 218D, the system 200 may have any suitable number of thermal plates.

In the illustrated implementation of FIG. 2, the heat-generating electronic components that are cooled by the system 200 includes heat-generating electronic components 260A, 260B, 260C, and 260D. The heat-generating electronic component 260A is positioned so as to be in contact with (or in close proximity to) thermal plate 218A. The heat-generating electronic component 260B is positioned so as to be in contact with (or in close proximity to) thermal plate 218B. The heat-generating electronic component 260C is positioned so as to be in contact with (or in close proximity to) thermal plate 218C. The heat-generating electronic component 260D is positioned so as to be in contact with (or in close proximity to) thermal plate 218D. However, the heat-generating electronic components that are cooled by the system 200 can include more or less than the four heat-generating electronic components 260A-260D shown in FIG. 2.

The second stage 230 includes a compressor 234 fluidly connected to the heat exchanger 250 via a fourth fluid pathway segment 232, a condenser 238 (with air-moving devices 240A, 240B, and 240C, which may be fans) fluidly connected to the compressor 234 via a fifth fluid pathway segment 236, an expansion valve 244 fluidly connected to the condenser 238 via a sixth fluid pathway segment 242, and a seventh fluid pathway segment 246 fluidly connecting the expansion valve 244 to the heat exchanger 250. Each of these components is the same as or similar to its counterpart component in the first stage 110 in FIG. 1.

However, in the system 200, the condenser 238 and the air-moving devices 240A, 240B, and 240C are formed as part of a combined radiator-condenser unit 260. The radiator-condenser unit 260 includes a condenser pathway that is formed by the condenser 238, and a radiator pathway that is formed by a radiator 262. The radiator 262 is fluidly connected to the output manifold 220 via the second fluid pathway segment 222, and to the heat exchanger 250 via an eighth fluid pathway segment 226. The radiator 262 receives the first cooling fluid from the output manifold 220 after the first cooling fluid has absorbing heat from the one or more heat-generating electronic components 260A-260D. The condenser 238, similar to the condenser 138 of system 100, receives the second cooling fluid from the compressor 234 after the compressor 234 increases the pressure of the second cooling fluid.

As the first cooling fluid and the second cooling fluid flow through the radiator-condenser unit 260, the air-moving devices 240A, 240B, and 240C can be operated to cause air to flow past the radiator 262 and the condenser 238. This air flow will remove heat from the second cooling fluid such that it transitions from the vapor phase to the liquid phase as its temperature decreases, similar to the system 100. However, this air flow will also remove heat from the first cooling fluid as the first cooling fluid flows through the radiator 262.

Thus, the system 200 utilizes the air flow generated by the air-moving devices 240A, 240B, and 240C to simultaneously remove heat from the first cooling fluid and the second cooling fluid, instead of only the second cooling fluid.

The radiator 262 directs the first cooling fluid to the heat exchanger 250 after heat has been removed from the first cooling fluid within the radiator 262. The condenser 238 directs the second cooling fluid to the expansion valve 244 via the sixth fluid pathway segment 242, where the pressure of the second cooling fluid is decreased to further decrease the temperature of the second cooling fluid. The second cooling fluid is then directed to the heat exchanger 250 via the seventh fluid pathway segment 246. In the heat exchanger, the second cooling fluid absorbs heat from the first cooling fluid, similar to the operation of the heat exchanger 150 in system 100. The first cooling fluid then flows through the CDU 212 and back toward the thermal plates 218A-218D, where the first cooling fluid can again remove heat from the heat-generating electronic components 260A-260D. The second cooling fluid flows back to the compressor 234 via the fourth fluid pathway segment 232.

Thus, the operation of the system 200 is similar to the operation of the system 100. The first cooling fluid circulates through the first stage 210 where it absorbs heat from one or more heat-generating electronic components 260A-260D, and then transfers heat to the second cooling fluid within the heat exchanger 250. The second cooling fluid circulates through the second stage where its pressure is increased with the compressor 234, its temperature is decreased with the condenser 238, and its pressure is then decreased with the expansion valve 244 to further decrease its temperature. The second cooling fluid then flows into the heat exchanger where it absorbs heat from the first cooling fluid. However, the use of the condenser 238 within a radiator-condenser unit 260 that includes the radiator 262 allows additional heat to be removed from the first cooling fluid.

The various components of the system 100 and the system 200 can be mounted in any suitable fashion. For example, in some implementations all of the components of the system 100 and the system 200 are mounted in the same rack as the heat-generating electronic components. In some of these implementations, the heat-generating electronic components are stacked vertically. Thus, the thermal plates can also be stacked vertically adjacent to (e.g., in direct contact with) the heat-generating electronic components. The input manifold and the output manifold can also extend vertically alongside the heat-generating electronic components, either on the same side of the rack or on different sides of the rack. In some implementations, the condenser can extend vertically along all of or a portion of the height of the rack. The air-moving devices can be formed as an air-moving device wall that extends vertically along all of or a portion of the height of the rack. This arrangement can maximize the surface area for the air from the air-moving device wall to flow over, in turn maximizing the heat removal capacity of the condenser.

Components such as the CDU, the heat exchanger, the compressor, and the expansion valve do not necessarily benefit from an increased surface area, and thus can be mounted within a small area above and/or below the heat-generating electronic components within the rack. However, in some implementations any of the CDU, the heat exchanger, the compressor, and the expansion valve could extend vertically along the height of the rack. Similarly, in some implementations, any of (and/or portions of) the input manifold, the output manifold, the condenser, and the air-moving devices could be mounted above and/or below the heat-generating electronic components. The thermal plates will generally be positioned in close proximity to the heat-generating electronic components, and generally cannot be placed anywhere within the rack. However, some implementations of the system 100 and the system 200 may use mechanisms to remove heat from the heat-generating electronic components other than the thermal plates. In these implementations, whatever components used to remove heat from the heat-generating electronic components can generally be placed at any suitable location within the rack. Further, while the illustrated implementation includes three air-moving devices 240A, 240B, and 240C, any suitable number of air-moving devices can be used with the system 200, including no air-moving devices.

Figure 3:
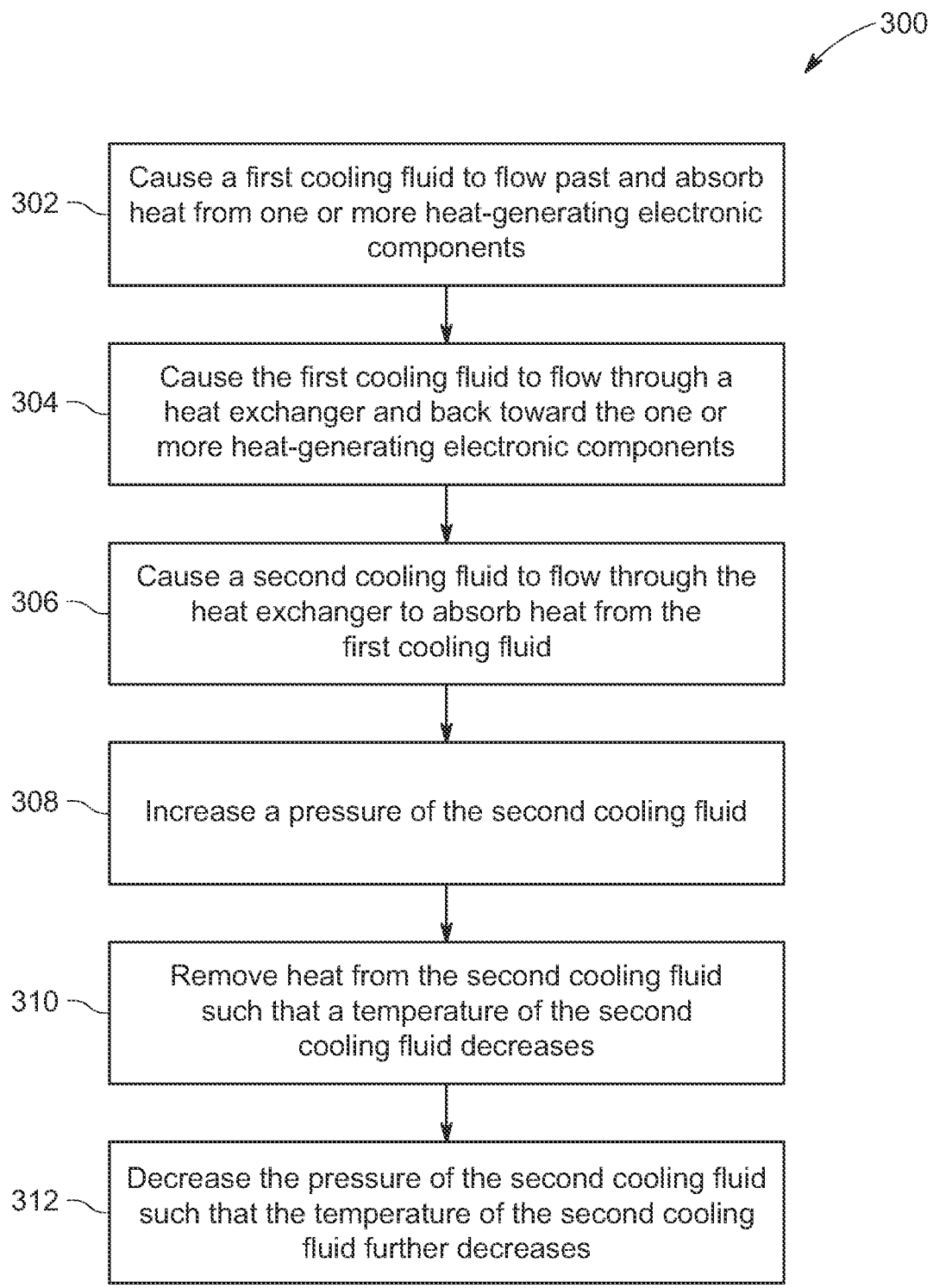
FIG. 3 is a flowchart of a method for cooling one or more heat-generating electronic components using the first system of FIG. 1 or the second system of FIG. 2, according to certain aspects of the present disclosure.

FIG. 3 shows a flowchart of a method 300 for cooling one or more heat-generating electronic components, according to certain aspects of the present disclosure. Method 300 can be implemented using a system that is the same as or similar to the system 100 or the system 200.

Step 302 of method 300 includes causing a first cooling fluid to flow past one or more heat-generating electronic components such that the first cooling fluid absorbs heat from the one or more heat-generating electronic components, and the temperature of the first cooling fluid increases.

Step 304 of the method 300 includes causing the first cooling fluid to flow through a heat exchanger, after the first cooling fluid absorbs heat from the one or more heat-generating electronic components. After the first cooling fluid flows through the heat exchanger, method 300 can include causing the first cooling fluid to continually flow back past the one or more heat-generating electronic components, and through the heat exchanger.

Step 306 of method 300 includes causing a second cooling fluid to flow through the heat exchanger as the first cooling fluid is flowing through the heat exchanger such that the second cooling fluid absorbs heat from the first cooling fluid and the temperature of the second cooling fluid increases. Increasing the temperature of the second cooling fluid within the heat exchanger will generally cause the second cooling fluid to transition from a liquid phase and a vapor phase.

Step 308 of the method 300 includes increasing the pressure of the second cooling fluid, for example using a compressor. Increasing the pressure of the second cooling fluid will generally increase the temperature of the second cooling fluid.

Step 310 of method 300 includes removing heat from the second cooling fluid, for example using a condenser such that the temperature of the second cooling fluid decreases. Removing heat from the second cooling fluid with the condenser will generally cause the second cooling fluid to transition from the vapor phase to the liquid phase.

Step 312 of method 300 includes decreasing the pressure of the second cooling fluid such that the temperature of the second cooling fluid further decreases. The pressure of the second cooling fluid can be decreased using an expansion valve. After the temperature of the second cooling fluid is further decreased, method 300 can include causing the second cooling fluid to flow back through the heat exchanger, where it absorbs heat from the first cooling fluid.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A cooling system for cooling one or more heat-generating electronic components of a computing system, the cooling system comprising:
a first stage having a first cooling path that is configured to circulate a first cooling fluid past the one or more heat-generating electronic components, the first cooling path causing the first cooling fluid to absorb heat from the one or more heat-generating electronic components such that a temperature of the first cooling fluid increases;
a second stage having a second cooling path that is configured to circulate a second cooling fluid, the second cooling path causing (i) an initial increase in a pressure of the second cooling fluid, (ii) subsequent to the initial increase in the pressure, heat to be removed from the second cooling fluid such that a temperature of the second cooling fluid decreases, and (iii) in response to the heat being removed, a decrease in the pressure of the second cooling fluid to further decrease the temperature of the second cooling fluid; and
a heat exchanger fluidly connected to the first cooling path and the second cooling path, the heat exchanger being configured to cause the second cooling fluid to flow past and absorb heat from the first cooling fluid, the temperature of the second cooling fluid increasing in response to absorbing the heat from the first cooling fluid,
wherein the first stage, the second stage, the heat exchanger, and the one or more heat-generating electronic components of the computing system are all positioned within a housing of the computing system,
wherein the first cooling fluid remains in a liquid phase as the first cooling fluid circulates through the first stage, and
wherein the second cooling fluid transitions between a liquid phase and a vapor phase as the second cooling fluid circulates through the second stage.

2. The cooling system of claim 1, wherein the first stage includes at least one thermal plate configured to contact the one or more heat-generating electronic components.

3. The cooling system of claim 2, wherein the at least one thermal plate is configured to receive the first cooling fluid such that the first cooling fluid flows past the one or more heat-generating electronic components.

4. The cooling system of claim 2, wherein the at least one thermal plate includes a plurality of thermal plates, each of the plurality of thermal plates being configured to receive a portion of the first cooling fluid.

5. The cooling system of claim 4, wherein the first stage includes an input manifold configured to receive the first cooling fluid from the heat exchanger and direct a respective portion of the first cooling fluid to each of the plurality of thermal plates, and wherein the first stage includes an output manifold configured to receive the respective portion of the first cooling fluid from each of the plurality of thermal plates and direct the first cooling fluid to the heat exchanger.

6. The cooling system of claim 2, wherein the first stage includes a distribution unit configured to cause the first cooling fluid to flow between the heat exchanger and the at least one thermal plate.

7. The cooling system of claim 1, wherein the second stage includes a compressor fluidly connected to the heat exchanger, the compressor being configured to receive the second cooling fluid from the heat exchanger in the vapor phase, and increase the pressure of the second cooling fluid such that the temperature of the second cooling fluid increases.

8. The cooling system of claim 7, wherein the second cooling fluid is a saturated vapor after absorbing heat from the first cooling fluid in the heat exchanger with the temperature of the second cooling fluid being equal to a saturation temperature of the second cooling fluid, and wherein the second cooling fluid is a superheated vapor after the temperature of the second cooling fluid increases in the compressor with the temperature of the second cooling fluid being greater than the saturation temperature of the second cooling fluid.

9. The cooling system of claim 7, wherein the second stage further includes a condenser fluidly connected to the compressor, the condenser being configured to remove heat from the second cooling fluid such that the temperature of the second cooling fluid decreases and at least a portion of the second cooling fluid flowing through the condenser transitions from the vapor phase to the liquid phase.

10. The cooling system of claim 9, wherein the second cooling fluid is a saturated liquid after the condenser removes heat from the second cooling fluid and the temperature of the second cooling fluid is equal to the saturation temperature of the second cooling fluid, or wherein the second cooling fluid is a subcooled liquid after the condenser removes heat from the second cooling fluid and the temperature of the second cooling fluid is less than the saturation temperature of the second cooling fluid.

11. The cooling system of claim 9, wherein the second stage further includes an expansion valve fluidly connected to the condenser, the expansion valve being configured to decrease the pressure of the second cooling fluid such that the temperature of the second cooling fluid further decreases.

12. The cooling system of claim 11, wherein the second cooling fluid is a liquid after the expansion valve decreases the pressure of the second cooling fluid, or wherein the second cooling fluid is a liquid-vapor mixture after the expansion valve decreases the pressure of the second cooling fluid.

13. The cooling system of claim 12, wherein the expansion valve is fluidly connected to the heat exchanger, and wherein the heat exchanger is configured to receive the second cooling fluid in the liquid phase or as the liquid-vapor mixture from the expansion valve.

14. The cooling system of claim 7, further comprising a radiator-condenser unit fluidly connected to the first stage and the second stage, the radiator-condenser unit including a radiator through which the first cooling fluid flows, and a condenser through which the second cooling fluid flows, the radiator-condenser unit being configured to remove heat from the first cooling fluid so that the first cooling fluid remains in the liquid phase and to remove heat from the second cooling fluid so that at least a portion the second cooling fluid transitions from the vapor phase to the liquid phase.

15. The cooling system of claim 14, wherein the radiator-condenser unit includes one or more air-moving devices configured to cause air to flow past the radiator while the first cooling fluid flows through the radiator and past the condenser while the second cooling fluid flows through the condenser to thereby remove heat from the first cooling fluid and the second cooling fluid.

16. The cooling system of claim 15, wherein the one or more air-moving devices are configured to cause the air to first flow past one of the radiator or the condenser so that the air absorbs heat from the first cooling fluid or the second cooling fluid, and to cause the heated air to then flow past the other of the radiator or the condenser.

17. The cooling system of claim 14, wherein the radiator is configured to receive the first cooling fluid after the first cooling fluid absorbs the heat from the one or more heat-generating electronic components, and direct the first cooling fluid to the heat exchanger after the heat is removed from the first cooling fluid.

18. The cooling system of claim 14, wherein the condenser is configured to receive the second cooling fluid from the compressor and direct the second cooling fluid to an expansion valve.

19. The cooling system of claim 1, wherein the housing of the computing system is a server rack.

20. A method of cooling one or more heat-generating electronic components of a computing system, the method comprising:
    causing a first cooling fluid to flow past and absorb heat from the one or more heat-generating electronic components, a temperature of the first cooling fluid increasing in response to the heat absorption;
    causing the first cooling fluid to flow through a heat exchanger after the first cooling fluid absorbs the heat from the one or more one heat-generating electronic components, and back toward the one or more heat-generating electronic components;
    causing a second cooling fluid to flow through the heat exchanger as the first cooling fluid flows through the heat exchanger such that the second cooling fluid absorbs heat from the first cooling fluid and a temperature of the second cooling fluid increases;
    increasing a pressure of the second cooling fluid using a compressor;
    subsequent to increasing the pressure of the second cooling fluid, removing heat from the second cooling fluid using a condenser such that the temperature of the second cooling fluid decreases; and
    subsequent to removing the heat from the second cooling fluid, decreasing the pressure of the second cooling fluid using an expansion valve such that the temperature of the second cooling fluid further decreases,
    wherein the first stage, the second stage, the heat exchanger, and the one or more heat-generating electronic components of the computing system are all positioned within a housing of the computing system,
    wherein the first cooling fluid remains in a liquid phase as the first cooling fluid circulates through the first stage, and
    wherein the second cooling fluid transitions between a liquid phase and a vapor phase as the second cooling fluid circulates through the second stage.

21. The method of claim 20, wherein the housing of the computing system is a server rack.

* * * * *